(12) United States Patent
Wang et al.

(10) Patent No.: US 10,700,298 B2
(45) Date of Patent: Jun. 30, 2020

(54) OLED DISPLAY PANEL AND ELECTRONIC DEVICE COMPRISING THE SAME

(71) Applicants: SHANGHAI TIANMA AM-OLED CO., LTD., Shanghai (CN); TIANMA MICRO-ELECTRONICS CO., LTD., Shenzhen (CN)

(72) Inventors: Xiangcheng Wang, Shanghai (CN); Chen Liu, Shanghai (CN); Wei He, Shanghai (CN); Jinghua Niu, Shanghai (CN); Yuji Hamada, Shanghai (CN); Ying Liu, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 239 days.

(21) Appl. No.: 15/652,034

(22) Filed: Jul. 17, 2017

(65) Prior Publication Data
US 2017/0317308 A1 Nov. 2, 2017

(30) Foreign Application Priority Data
Dec. 28, 2016 (CN) .......................... 2016 1 1240049

(51) Int. Cl.
*H01L 51/50* (2006.01)
*H01L 51/00* (2006.01)
(Continued)

(52) U.S. Cl.
CPC ........ *H01L 51/5064* (2013.01); *H01L 51/006* (2013.01); *H01L 51/0059* (2013.01);
(Continued)

(58) Field of Classification Search
None
See application file for complete search history.

(56) References Cited

U.S. PATENT DOCUMENTS

2007/0152573 A1 7/2007 Kim et al.
2009/0072720 A1* 3/2009 Lee .................. H01L 51/5044
313/504
(Continued)

FOREIGN PATENT DOCUMENTS

| CN | 102959009 A | 3/2013 |
| CN | 103094309 A | 5/2013 |
| CN | 104752480 A | 7/2015 |

*Primary Examiner* — Jay Yang
(74) *Attorney, Agent, or Firm* — Alston & Bird LLP (57) ABSTRACT

The present invention relates to an OLED display panel comprising a first electrode, and a first hole transporting layer, a second hole transporting layer, and an electron transporting layer stacked on the first electrode, and a second electrode formed; at least two light emitting units are provided on the second hole transporting layer; the electron transporting layer covers the light emitting units; the material of the electron transporting layer fills the gap(s) between adjacent light emitting units; the first hole transporting layer comprises a hole transporting material which has a hole mobility of $9 \times 10^{-5}$-$5 \times 10^{-4}$ cm$^2$/V·S, and a solubility of 10 g/L or more in a cleaning solvent at 25° C. The present invention utilizes a hole transporting material having a specific hole mobility as a common hole transporting layer, avoiding crosstalks between different pixels.

15 Claims, 2 Drawing Sheets

(51) Int. Cl.
*H01L 27/32* (2006.01)
*H01L 51/56* (2006.01)
*H01L 51/52* (2006.01)

(52) U.S. Cl.
CPC ........ *H01L 51/0061* (2013.01); *H01L 51/506* (2013.01); *H01L 51/5072* (2013.01); *H01L 51/56* (2013.01); *H01L 27/3206* (2013.01); *H01L 27/3211* (2013.01); *H01L 51/0011* (2013.01); *H01L 51/0052* (2013.01); *H01L 51/0058* (2013.01); *H01L 51/0085* (2013.01); *H01L 51/5056* (2013.01); *H01L 51/5265* (2013.01)

(56) References Cited

U.S. PATENT DOCUMENTS

2013/0105775 A1* 5/2013 Takaya ................ H01L 51/5028
  257/40
2015/0179941 A1* 6/2015 Miyata ................ C07D 333/76
  257/40

* cited by examiner

OLED DISPLAY PANEL AND ELECTRONIC DEVICE COMPRISING THE SAME

CROSS-REFERENCE TO RELATED APPLICATIONS

This application claims priority to the Chinese patent application No. CN 201611240049.X filed on Dec. 28, 2016 and titled "OLED Display Panel and Electronic Device Having the same", which is incorporated herein by reference in its entirety.

TECHNICAL FIELD

The present application pertains to the field of organic light-emitting diodes, and more particularly to an OLED display panel and an electronic device having the same.

BACKGROUND

Figure 1:
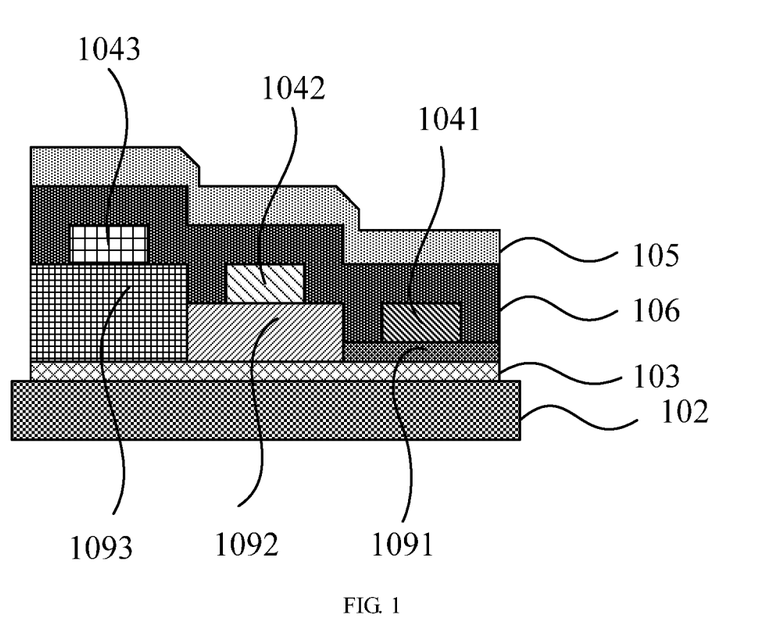
FIG. 1 shows a schematic cross-sectional structure view of an OLED display panel according to one specific embodiment of the present invention.

Mobile phones and many other small and medium size OLED screens use R, G, B sub-pixel display mode (FIG. 1). In order to improve the production yield, some functional layers are often designed as public layers, so that FMM (fine metal mask) can be used less. Hole transporting layer often uses a public layer, and general public hole transporting layer may use commercially available materials. The commercially available hole transporting layer materials have a molecular structure of, e.g.

(EP-721935)

However, such material has a higher longitudinal mobility rate, and the lateral mobility rate thereof is not very high. There will be no occurrence of crosstalk between pixels.

CN103108859 discloses wherein the material has a good solubility, and a higher mobility rate.

There are several problems in the current technologies of hole transporting materials. First, the material solubility is not good, which leads to a poor cleaning effect of masks for evaporation during mass production. Second, the material mobility rate is too low, which will lead to an excessive overall voltage of devices. Third, the mobility rate of the material, especially the lateral mobility rate of the material, is too high, leading to crosstalk of adjacent pixels.

The mobility rate of the commercially available material in EP-721935 falls within the acceptable range, and no crosstalk will occur. However, the solubility thereof is not very good. The solubility of the commercially available material in CN103108859 is acceptable, but too high mobility rate leads to lateral leakage current to form crosstalk.

There is a need in the field for the development of OLED devices which have small crosstalks between pixels and are suitable for mask cleaning process.

SUMMARY

In view of the deficiencies of the prior art, the first object of the present invention is to provide an OLED display panel comprising a first electrode, and a first hole transporting layer, a second hole transporting layer, and an electron transporting layer stacked sequentially on the first electrode, and a second electrode formed thereon; at least two light emitting units are provided on the second hole transporting layer; the electron transporting layer covers the light emitting units; and the material of the electron transporting layer fills the gap(s) between adjacent light emitting units; the first hole transporting layer comprises a hole transporting material; the hole transporting material has a hole mobility of $9\times10^{-5}$-$5\times10^{-4}$ cm$^2$/V·S, and a solubility of 10 g/L or more in N-methylpyrrolidone at 25° C.

The second object of the present invention is to provide an electronic device comprising the OLED display panel as stated in the first object of the present invention.

Compared with the prior art, the present invention has the following beneficial effects:

The present invention utilizes a hole transporting material having a specific hole mobility as a common hole transporting layer, which can avoid crosstalk between different pixels. Meanwhile, the specific solubility range thereof in mask cleaning solvent can solve the problem that the mask is difficult to clean.

DETAIL DESCRIPTION

For the purpose of understanding the present invention, the present invention discloses the following examples. Those skilled in the art shall know that the examples are merely illustrative of the present invention and should not be construed as limiting the present invention.

In a specific embodiment, the present application provides an OLED display panel. Said OLED display panel comprises a first electrode, and a first hole transporting layer, a second hole transporting layer, and an electron transporting layer stacked sequentially on the first electrode, and a second electrode formed thereon. At least two light emitting units are provided on the second hole transporting layer. The electron transporting layer covers the light emitting units. And the material of the electron transporting layer fills the gap(s) between adjacent light emitting units. The first hole transporting layer comprises a hole transporting material. The hole transporting material has a hole mobility of $9\times10^{-5}$-$5\times10^{-4}$ cm$^2$/V·S, for example $1.0\times10^{-4}$ cm$^2$/V·S, $1.2\times10^{-4}$ cm$^2$/V·S, $1.3\times10^{-4}$ cm$^2$/V·S, $1.4\times10^{-4}$ cm$^2$/V·S, $1.6\times10^{-4}$ cm$^2$/V·S, $1.8\times10^{-4}$ cm$^2$/V·S, $1.9\times10^{-4}$ cm$^2$/V·S, $2.0\times10^{-4}$ cm$^2$/V·S, $2.2\times10^{-4}$ cm$^2$/V·S, $2.4\times10^{-4}$ cm$^2$/V·S, $2.5\times10^{-4}$ cm$^2$/V·S, $2.7\times10^{-4}$ cm$^2$/V·S, $2.9\times10^{-4}$ cm$^2$/V·S, $3.1\times10^{-4}$ cm$^2$/V·S, $3.3\times10^{-4}$ cm$^2$/V·S, $3.5\times10^{-4}$ cm$^2$/V·S, $3.7\times10^{-4}$ cm$^2$/V·S, $3.8\times10^{-4}$ cm$^2$/V·S, $4.0\times10^{-4}$ cm$^2$/V·S, $4.2\times10^{-4}$ cm$^2$/V·S, $4.7\times10^{-4}$ cm$^2$/V·S, $4.9\times10^{-4}$ cm$^2$/V·S, etc.

The hole transporting material has a solubility of 10 g/L or more in a mask cleaning solvent at 25° C., for example 11 g/L, 12 g/L, 13 g/L, 14 g/L, 17 g/L, 19 g/L, 21 g/L, 23 g/L, 25 g/L, 27 g/L, 29 g/L, 31 g/L, 32 g/L, etc.

Preferably, the mask cleaning solvent is anyone selected from the group consisting of N-methylpyrrolidone, cyclohexanone, substituted or unsubstituted furan, and isopropanol, or a mixture of at least two of them.

The exemplary substituted or unsubstituted furan is anyone selected from the group consisting of furan, dihydrofuran, methylfuran, and tetrahydrofuran, or a combination of at least two of them.

In the OLED device structure, a hole transporting layer having a specific hole mobility ($9\times10^{-5}$-$5\times10^{-4}$ cm$^2$/V·S) can ensure that no crosstalk occurs between pixels, and the specific solubility in mask cleaning solvent can ensure that the mask is thoroughly cleaned to improve the yield of good products.

In a specific embodiment, the second hole transporting layer comprises at least two independent hole transporting units, the independent hole transporting units being provided between the first hole transporting layer and the light emitting units.

In a specific embodiment, an independent hole transporting unit is provided between each light emitting unit and the first hole transporting layer.

The independent hole transporting units described in the present invention can be understood as hole transporting layers dedicated to different light emitting units. The independent hole transporting units are capable of supplementing the microcavity effect caused by the difference in pixels (e.g., red, green, and blue) by adjusting the thickness thereof. For example, with respect to red light emitting layer which has a longer hole transporting distance, it can be adjusted by setting the independent hole transporting layer to have a larger thickness. In addition, in the second hole transporting layer, ideally, the hole transporting units should transmit only the light emitted by the corresponding light emitting unit (pixel), thereby avoiding crosstalk between adjacent pixels.

In a specific embodiment, each hole transporting unit is independently selected to be the same as or different from the first hole transporting layer.

The material of the hole transporting units may optionally be the same as or different from that of the first hole transporting layer. If the material of the hole transporting units of the second hole transporting layer is the same as that of the first hole transporting layer, a hole transporting layer having different thicknesses is formed, and those skilled in the art can design the thickness of the hole transporting layer according to the pixels of the light emitting units, for example, the thickness of the red light transmission path is designed to be twice the red light wavelength.

In a preferred embodiment, the hole transporting material has a structure of formula (I):

formula (I)

wherein $L_1$ is anyone selected from the group consisting of biphenylene containing substituent(s), substituted or unsubstituted fluorenylidene, and substituted or unsubstituted wherein $X_1$ and $X_2$ are substituents;
the two benzene rings in substituted or unsubstituted fluorenylidene are connected with the two nitrogen atoms in formula (I) respectively; the two benzene rings in biphenylene containing substituent(s) are connected with the two nitrogen atoms in formula (I) respectively; the two benzene rings in substituted or unsubstituted are connected with the two nitrogen atoms in formula (I) respectively;

$L_2$, $L_3$, $L_4$ and $L_5$ are each independently selected from the group consisting of substituted or unsubstituted aromatic groups.

Preferably, the substituent of biphenylene containing substituent(s) includes anyone of linear chain or branched chain alkyl of C1-C5, linear chain or branched chain alkoxy of C1-C5.

The exemplary substituted or unsubstituted fluorenylidene is selected from the group consisting of alkyl-substituted fluorenylidene, alkenyl-substituted fluorenylidene, aryl-substituted fluorenylidene, and amino-substituted fluorenylidene, preferably C1-C6 alkyl-substituted fluorenylidene, C2-C6 alkenyl-substituted fluorenylidene, C5-C8 aryl-substituted fluorenylidene, amino-substituted fluorenylidene, wherein the typical but non-limitative examples comprise:

-continued and the like.

The exemplary biphenylene containing substituent(s) is selected from the group consisting of alkyl-substituted biphenylene, alkenyl-substituted biphenylene, aryl-substituted biphenylene, and amino-substituted biphenylene, preferably C1-C6 alkyl-substituted biphenylene, C2-C6 alkenyl-substituted biphenylene, C5-C8 aryl-substituted biphenylene, amino-substituted biphenylene, wherein the typical but non-limitative examples comprise and the like.

The substituted or unsubstituted includes, for example and the like.

The substituted or unsubstituted aromatic groups include phenyl, methylphenyl, ethylphenyl, methoxyphenyl or methylnaphthyl and the like.

In a preferred embodiment, $L_1$ is anyone selected from the group consisting of or a combination of at least two of them. Wherein $R_1$, $R_2$, $R_3$, $R_4$, $R_5$, $R_6$, $R_7$, $R_8$, $R_9$, and $R_{10}$ are each independently anyone selected from the group consisting of hydrogen atom, deuterium atom, linear chain or branched chain alkyl of C1-C5, and linear chain or branched chain alkoxy of C1-C5; $R_5$ and $R_6$ cannot simultaneously be hydrogen atom and/or deuterium atom.

Examples of the linear chain or branched chain alkyl of C1-C5 include methyl, ethyl, n-propyl, n-butyl, t-butyl, pentyl and the like.

Examples of the linear chain or branched chain alkoxy of C1-C5 include methoxy, ethoxy, n-propoxy, t-butoxy and the like.

In a specific embodiment, $L_2$, $L_3$, $L_4$ and $L_5$ are each independently anyone selected from the group consisting of substituted or unsubstituted phenyl, substituted or unsubstituted biphenyl, substituted or unsubstituted fused ring group, substituted or unsubstituted heteroaromatic ring group, or a combination of at least two of them.

The exemplary fused ring group includes naphthalene ring group, anthracene ring group, and the like.

In a specific embodiment, $L_2$, $L_3$, $L_4$ and $L_5$ are each independently anyone selected from the group consisting of or a combination of at least two of them; wherein $R'_1$, $R'_2$, $R'_3$, $R'_4$, $R'_5$, $R'_6$, $R'_7$, $R'_8$, $R'_9$, $R'_{10}$, $R'_{11}$, $R'_{12}$, and $R'_{13}$ can be each independently anyone selected from the group consisting of hydrogen atom, deuterium atom, linear chain or branched chain alkyl of C1-C5, and linear chain or branched chain alkoxy of C1-C5.

In a specific embodiment, the hole transporting material includes anyone of

-continued or a combination of at least two of them.

In a specific embodiment, the thickness of the first hole transporting layer is 600-2300 Å.

In a specific embodiment, the first hole transporting layer is doped with a P-type organic material in the hole transporting material.

Preferably, the p-type organic material has a doping ratio of 1 to 10 wt % in the first hole transporting layer, e.g. 2 wt %, 3 wt %, 4 wt %, 5 wt %, 6 wt %, 7 wt %, 8 wt %, 9 wt % and the like.

In a specific embodiment, the at least two light emitting units include anyone selected from the group consisting of a blue light emitting unit, a green light emitting unit and a red light emitting unit, or a combination of at least two of them.

Preferably, the green light emitting unit and the red light emitting unit adopt a phosphorescent material, and the blue light emitting unit adopts a fluorescent material.

Preferably, the OLED display panel has a red light external quantum efficiency of 16% or more, a green light external quantum efficiency of 16% or more, and a blue light external quantum efficiency of 10% or more.

The exemplary material of the first electrode of the present invention is anyone selected from the group consisting of indium tin oxide, indium zinc oxide and tin dioxide, or a combination of at least two of them.

The exemplary material of the second electrode of the present invention is anyone selected from the group consisting of magnesium, aluminum, silver, or a combination of at least two of them.

The exemplary material of the hole injection layer of the present invention is anyone selected from the group consisting of

TDATA ( ),

2-TNATA ( ) and

TCTA ( ), or a combination of at least two of them.

The exemplary material of the electron transporting layer is anyone selected from the group consisting of BPhen ( ), tri-(8-hydroxyquinoline) and TPBi ( ), or a combination of at least two of them.

In a specific embodiment, the OLED display panel (shown in FIG. 1 for a schematic cross-sectional structure view of the OLED display panel) of the present invention comprises a first electrode 102, and a first hole transporting layer 103, a second hole transporting layer, and an electron transporting layer 106 stacked sequentially on the first electrode 102, and a second electrode 105 formed thereon.

The second hole transporting layer includes a red light independent hole transporting unit 1093, a green light independent hole transporting unit 1092, and a blue light independent hole transporting unit 1091; wherein a red light emitting unit 1043 is provided on the red light independent hole transporting unit 1093, a green light emitting unit 1042 is provided on the green light independent hole transporting unit 1092, and a blue light emitting unit 1041 is provided on the blue light independent hole transporting unit 1091.

The material of the electron transporting layer 106 fills the gaps between the adjacent light emitting units.

In another specific embodiment, the OLED display panel (shown in FIG. 2 for a schematic cross-sectional structure view of the OLED display panel) of the present invention comprises a first electrode 202, and a first hole transporting layer 203, a second hole transporting layer, and an electron transporting layer 206 stacked sequentially on the first electrode 202, and a second electrode 205 formed thereon.

Figure 2:
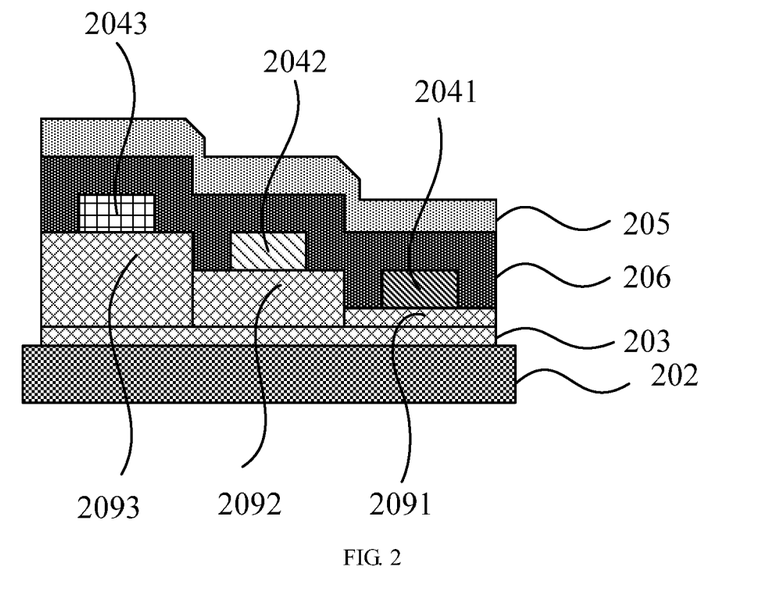
FIG. 2 shows a schematic cross-sectional structure view of another OLED display panel according to one specific embodiment of the present invention.

The second hole transporting layer includes a red light independent hole transporting unit 2093, a green light independent hole transporting unit 2092, and a blue light independent hole transporting unit 2091; wherein a red light emitting unit 2043 is provided on the red light independent hole transporting unit 2093, a green light emitting unit 2042 is provided on the green light independent hole transporting unit 2092, and a blue light emitting unit 2041 is provided on the blue light independent hole transporting unit 2091; the materials of the red light independent hole transporting unit 2093, the green light independent hole transporting unit 2092 and the blue light independent hole transporting unit 2091 are all the same as that of the first hole transporting layer 203.

The material of the electron transporting layer 206 fills the gaps between the adjacent light emitting units.

In yet another specific embodiment, the OLED display panel (shown in FIG. 3 for a schematic cross-sectional structure view of the OLED display panel) of the present invention comprises a first electrode 302, and a first hole transporting layer 303, a second hole transporting layer, and an electron transporting layer 306 stacked sequentially on the first electrode 302, and a second electrode 305 formed thereon.

Figure 3:
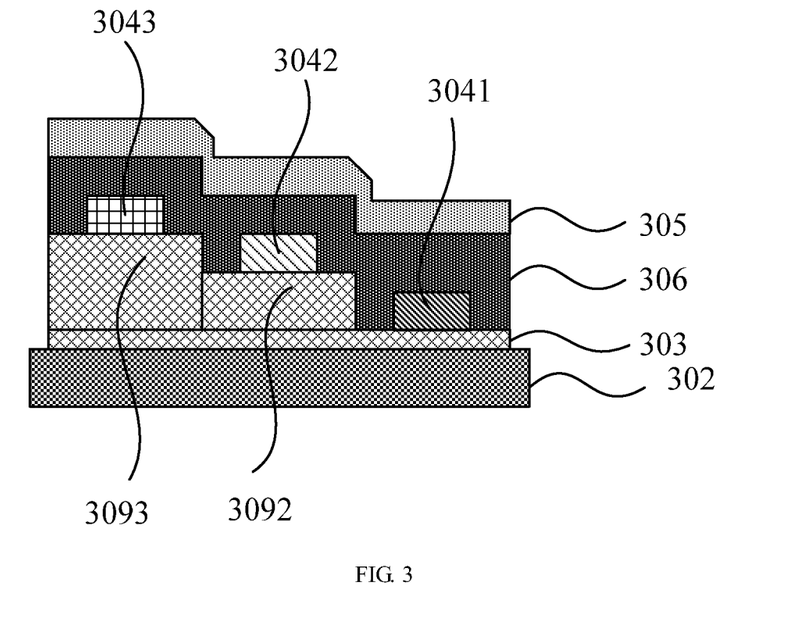
FIG. 3 shows a schematic cross-sectional structure view of yet another OLED display panel according to one specific embodiment of the present invention.

The second hole transporting layer includes a red light independent hole transporting unit 3093 and a green light independent hole transporting unit 3092; wherein a red light emitting unit 3043 is provided on the red light independent hole transporting unit 3093, a green light emitting unit 3042 is provided on the green light independent hole transporting unit 3092.

The material of the electron transporting layer fills the gaps between the adjacent light emitting units.

Compared to the OLED device shown in FIG. 2, the thickness of the blue light independent hole transporting unit is zero.

Those skilled in the art shall know that the OLED display panels listed in the present invention are not capable of exemplifying all of the structures, and those skilled in the art can also design the display panel according to actual situations. For example, those skilled in the art can set up different thicknesses to the hole transporting layers corresponding to the red light emitting unit, the blue light emitting unit and the green light emitting unit, so as to satisfy the microcavity effect produced by the light emitting units of different colors. Those skilled in the art can also provide an exclusive transporting layer between the light emitting unit and the common hole transporting layer. For example, a red light-hole transporting unit is provided between the luminescent material of the red light emitting unit and the common hole transporting layer; a green light-hole transporting unit is provided between the luminescent material of the green light emitting unit and the common hole transporting layer; and a blue light-hole transporting unit is provided between the luminescent material of the blue light emitting unit and the common hole transporting layer. Those skilled in the art can also set a buffer layer in the OLED device to reflect the light emitted by the light emitting unit to the first electrode, and also a cap layer to improve efficiency of the device.

Figure 4:
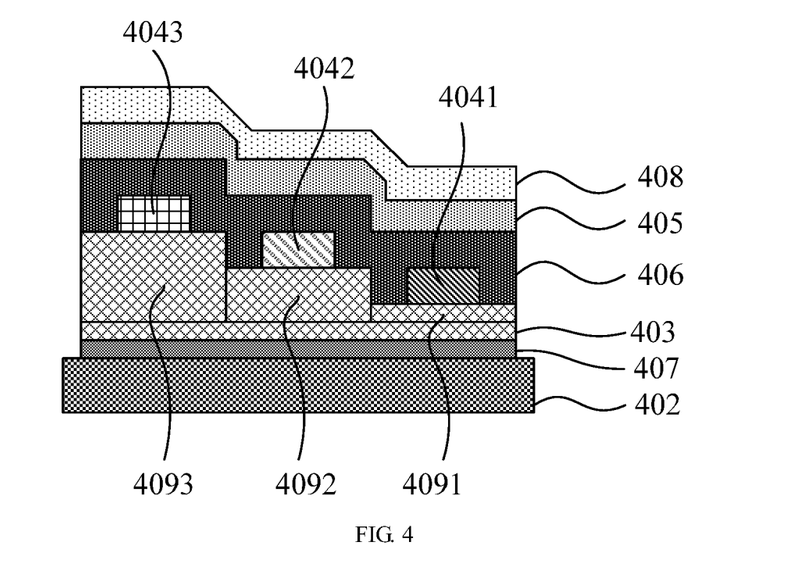
FIG. 4 shows a schematic cross-sectional structure view of yet another OLED display panel according to one specific embodiment of the present invention.

Illustratively, the OLED device may also have the structure of FIG. 4. Specifically, the OLED device comprises a first electrode 402, and a buffer layer 407, a first hole transporting layer 403, a second hole transporting layer (a red light independent hole transporting layer 4093, a green light independent hole transporting layer 4092 and a blue light independent hole transporting layer 4091), and an electron transporting layer 406 stacked sequentially on the first electrode 402, a second electrode 405 formed thereon, and a cap layer 408 overlying the second electrode 405. A red light emitting unit 4043 is also provided on the red light independent hole transporting layer 4093 of the second hole transporting layer. A green light emitting unit 4042 is also provided on the green light independent hole transporting layer 4092 of the second hole transporting layer. A blue light emitting unit 4041 is also provided on the blue light independent hole transporting layer 4091 of the second hole transporting layer. The electron transporting layer 406 covers the blue light emitting unit 4041, the green light emitting unit 4042 and the red light emitting unit 4043, and the gaps between the blue light emitting unit 4041, the green light emitting unit 4042 and the red light emitting unit 4043.

In a specific embodiment, the stacked layers further comprise anyone of a hole injection layer, an electron transporting layer, and an electron injection layer, or a combination of at least two of them.

In a specific embodiment, the first electrode is anode and the second electrode is cathode.

The present invention also provides an electronic device comprising the OLED display panel as previously described.

The compounds of the present invention having a structure represented by formula (I) can be synthesized by the prior art, for example:

When $L_3$ and $L_5$ are the same, and $L_2$ and $L_4$ are the same, the preparation process can be simplified as:

Synthesis Example 1

To a 500 mL three-necked flask were added 5 g (13.8 mmol) of an intermediate 1, 2.3 g (6.9 mmol) of an intermediate 2, 30.9 mg (0.138 mmol) of palladium acetate and 1.1 g (13.9 mmol) of sodium t-butoxide. The flask was filled with nitrogen; 100 mL of dehydrated toluene and 0.12 mL (0.276 mmol) of tri-tert-butylphosphine were added to the flask. The mixture was placed in an oil bath and slowly heated to 110° C. for 8 hours and allowed to stand overnight. The resulted solid was dissolved in dichloromethane, washed with 300 mL of saturated brine, and the organic layer was dried with magnesium sulfate. Recrystallization was made by using a mixed solvent of toluene and ethanol to give 4.3 g (5.0 mmol) of a target compound with a yield of 72%. Mass spectrometry M/Z=900.6 was obtained by LC-MS.

Synthesis Example 2

-continued

To a 500 mL three-necked flask were added 5 g (14.3 mmol) of an intermediate 3, 2.3 g (6.9 mmol) of an intermediate 2, 30.9 mg (0.138 mmol) of palladium acetate and 1.1 g (13.9 mmol) of sodium t-butoxide. The flask was filled with nitrogen; 100 mL of dehydrated toluene and 0.12 mL (0.276 mmol) of tri-tert-butylphosphine were added to the flask. The mixture was placed in an oil bath and slowly heated to 110° C. for 8 hours and allowed to stand overnight. The resulted solid was dissolved in dichloromethane, washed with 300 mL of saturated brine, and the organic layer was dried with magnesium sulfate. Recrystallization was made by using a mixed solvent of toluene and ethanol to give 4.5 g (5.17 mmol) of a target compound with a yield of 75%. Mass spectrometry M/Z=876.5 was obtained by LC-MS.

Example 1

An OLED display panel having the structure shown in FIG. 4 was prepared by the following process.

On the substrate of glass material, a reflective silver anode of 100 nm was formed, and then an ITO film layer was deposited at a film thickness of 15 nm to obtain a first electrode 402 as an anode. Then a mixed material of was evaporated as a buffer layer, wherein the mixing ratio was 5:95 (by weight). Thereafter, was vacuum-evaporated by using a fine metal mask to form films having thicknesses of 210 nm, 170 nm and 130 nm respectively on red light, green light and blue light pixels, so as to give a hole transporting layer (including a first hole transporting layer 403, and a second hole transporting layer 4091, 4092, and 4093) having a hole mobility rate of $2 \times 10^{-4}$ $cm^2/V \cdot S$ and a solubility in NMP of 15 g/L. 40 nm of was evaporated at an evaporation rate ratio of 95:5 to form an emission red light emitting unit 4043; 40 nm of

-continued was evaporated at an evaporation rate ratio of 9:1 to form an emission green light emitting unit 4042; 30 nm of was evaporated at an evaporation rate ratio of 95:5 to form an emission blue light emitting unit 4041; an evaporation material of was co-evaporated at an evaporation rate ratio of 1:1 to form an electron transporting layer 406 having a thickness of 30 nm, and then form a magnesium-silver alloy (having a mass ratio of silver to magnesium of 9:1) having a thickness of 15 nm as the second electron 405. 60 nm of a cap layer 408 8-hydroxyquinoline aluminum was evaporated, and then covered with protective glass sheets.

Example 2

It is different from Example 1 that the material of the hole transporting layer was replaced with which has a hole mobility rate of $1.2 \times 10^{-4}$ cm$^2$/V·S and a solubility in NMP of 25 g/L.

Example 3

It is different from Example 1 that the material of the hole transporting layer was replaced with which has a hole mobility rate of $2.5 \times 10^{-4}$ cm$^2$/V·S and a solubility in NMP of 12 g/L.

Example 4

It is different from Example 1 that the material of the hole transporting layer was replaced with , which has a hole mobility rate of $2.4 \times 10^{-4}$ cm$^2$/V·S and a solubility in NMP of 12 g/L.

Example 5

It is different from Example 1 that the material of the hole transporting layer was replaced with , which has a hole mobility rate of $3.5 \times 10^{-4}$ cm$^2$/V·S and a solubility in NMP of 22 g/L.

Example 6

It is different from Example 1 that the material of the hole transporting layer was replaced with , which has a hole mobility rate of $3 \times 10^{-4}$ cm$^2$/V·S and a solubility in NMP of 28 g/L.

Example 7

It is different from Example 1 that the material of the hole transporting layer was replaced with , which has a hole mobility rate of $5 \times 10^{-4}$ cm$^2$/V·S and a solubility in NMP of 30 g/L.

Example 8

It is different from Example 1 that the material of the hole transporting layer was replaced with , which has a hole mobility rate of $4 \times 10^{-4}$ cm$^2$/V·S and a solubility in NMP of 35 g/L.

Example 9

It is different from Example 1 that the material of the hole transporting layer was replaced with , which has a hole mobility rate of $4 \times 10^{-4}$ cm$^2$/V·S and a solubility in NMP of 35 g/L.

Example 10

It is different from Example 1 that the material of the hole transporting layer was replaced with which has a hole mobility rate of $2.1 \times 10^{-4}$ cm$^2$/V·S and a solubility in NMP of 19 g/L.

Example 11

It is different from Example 1 that the material of the hole transporting layer was replaced with which has a hole mobility rate of $1.8 \times 10^{-4}$ cm$^2$/V·S and a solubility in NMP of 15 g/L.

Example 12

It is different from Example 1 that the material of the hole transporting layer was replaced with which has a hole mobility rate of $1.9 \times 10^{-4}$ cm$^2$/V·S and a solubility in NMP of 21 g/L.

Comparative Example 1

It is different from Example 1 that the material of the hole transporting layer was replaced with which has a hole mobility rate of $3 \times 10^{-4}$ cm$^2$/V·S and a solubility in NMP of 1.2 g/L.

Comparative Example 2

It is different from Example 1 that the material of the hole transporting layer was replaced with which has a hole mobility rate of $3.2 \times 10^{-4}$ cm$^2$/V·S and a solubility in NMP of 5.2 g/L.

Comparative Example 3

It is different from Example 1 that the material of the hole transporting layer was replaced with which has a hole mobility rate of $7 \times 10^{-5}$ cm$^2$/V·S and a solubility in NMP of 2.5 g/L.

Comparative Example 4

It is different from Example 1 that the material of the hole transporting layer was replaced with which has a hole mobility rate of $2\times10^{-4}$ cm$^2$/V·S and a solubility in NMP of 2.2 g/L.

Performance Tests

Performance tests of the OLED display panels in the Examples and Comparative Examples were carried out.

(1) Device voltage test method: the program being transferred to the B screen, testing the voltage of the blue light at 10 mA/cm$^2$;

(2) Crosstalk test method: the program being transferred to the B screen in a dark room, testing the intensity ratio of the green light of adjacent pixels when the blue light intensity was 0.1 Cd/m$^2$, $L_{Green}/L_{Blue}$;

(3) Mask cleaning effect:

the time required for all the materials on the MASK of the red light of the hole transporting layer 203 to be completely cleaned at a fixed ultrasonic frequency of 40 kHz and at a temperature of 25° C.

Test results can be seen in Table 1.

TABLE 1

| | Device voltage | $L_{Green}/L_{Blue}$ | Mask cleaning time |
|---|---|---|---|
| Example 1 | 102% | 1.9% | 20 s |
| Example 2 | 108% | 2.1% | 15 s |
| Example 3 | 102% | 1.7% | 20 s |
| Example 4 | 102% | 1.7% | 20 s |
| Example 5 | 98% | 1.9% | 35 |
| Example 6 | 101% | 1.5 | 25 |
| Example 7 | 96% | 3.1% | 25 |
| Example 8 | 98% | 2.7% | 25 |
| Example 9 | 98% | 1.8% | 30 s |
| Example 10 | 106% | 2.1% | 25 s |
| Example 11 | 105% | 1.3% | 25 s |
| Example 12 | 102% | 1.3% | 23 s |
| Comparative Example 1 | 100% | 1.5% | 80 s |
| Comparative Example 2 | 100% | 1.8% | 60 s |
| Comparative Example 3 | 106% | 1.0% | 58 s |
| Comparative Example 4 | 103% | 1.7% | 65 s |

The applicant stated that the present invention illustrates the detailed process equipment and process flow by the above-described examples, but the present invention is not limited to the above-described detailed process equipment and process flow. That is to say, it does not mean that the present invention cannot be carried out unless the above-described detailed process equipment and process flow are used. Those skilled in the art shall know that any improvements to the present invention, equivalent replacements of the raw materials of the present invention, addition of auxiliary ingredients, selection of specific means and the like all fall within the protection and disclosure scope of the present invention.

What is claimed is:

1. An OLED display panel, comprising:

a first electrode, a first hole transporting layer, a second hole transporting layer, an electron transporting layer and a second electrode stacked in sequence;

at least two light emitting units disposed between the second hole transporting layer and the electron transporting layer, wherein a material of the electron transporting layer fills a gap between adjacent light emitting units;

wherein the first hole transporting layer comprises a hole transporting material with a hole mobility in a range of $9\times10^{-5}$ to $5\times10^{-4}$ cm$^2$/V·S; and wherein the hole transporting material has a solubility of 10 g/L or more in a cleaning solvent at 25° C. during cleaning;

wherein the hole transporting material includes anyone of and a combination of at least two of them.

2. The OLED display panel of claim 1, wherein the cleaning solvent is anyone selected from the group consisting of N-methylpyrrolidone, cyclohexanone, substituted or unsubstituted furan, and isopropanol, and a mixture of at least two of them.

3. The OLED display panel of claim 1, wherein the second hole transporting layer comprises at least two independent hole transporting units, wherein the independent hole transporting units are provided between the first hole transporting layer and the light emitting units.

4. The OLED display panel of claim 3, one of the two independent hole transporting units is disposed between one of the two light emitting units and the first hole transporting layer.

5. The OLED display panel of claim 3, wherein each hole transporting unit is independently selected to be the same as or different from the first hole transporting layer.

6. The OLED display panel of claim 1, wherein a thickness of the first hole transporting layer is in the range of 600-2300 Å.

7. The OLED display panel of claim 1, wherein the first hole transporting layer is doped with a P-type organic material in the hole transporting material.

8. The OLED display panel of claim 7, wherein the p-type organic material has a doping ratio of 1 to 10 wt % in the first hole transporting layer.

9. The OLED display panel of claim 1, wherein the at least two light emitting units are selected from the group consisting of a blue light emitting unit, a green light emitting unit and a red light emitting unit, or a combination of at least two of them.

10. The OLED display panel of claim 9, wherein the green light emitting unit and the red light emitting unit each comprises a phosphorescent material, and wherein the blue light emitting unit comprises a fluorescent material.

11. The OLED display panel of claim 9, wherein the OLED display panel has a red light external quantum efficiency of 16% or more, a green light external quantum efficiency of 16% or more, and a blue light external quantum efficiency of 10% or more.

12. The OLED display panel of claim 1, wherein the second hole transporting layer comprises a red light independent hole transporting unit, a blue light independent hole transporting unit, and a green light independent hole transporting unit, wherein a red light emitting unit is provided on the red light independent hole transporting unit, a green light emitting unit is provided on the green light independent hole transporting unit, and a blue light emitting unit is provided on the blue light independent hole transporting unit.

13. The OLED display panel of claim 12, wherein the red light independent hole transporting unit, the green light independent hole transporting unit and the blue light independent hole transporting unit are disposed on the first hole transporting layer.

14. The OLED display panel of claim 1, wherein the first electrode is anode and the second electrode is cathode.

15. An electronic device comprising the OLED display panel of claim 1.

* * * * *